United States Patent
Mueller et al.

(10) Patent No.: US 6,259,309 B1
(45) Date of Patent: Jul. 10, 2001

(54) METHOD AND APPARATUS FOR THE REPLACEMENT OF NON-OPERATIONAL METAL LINES IN DRAMS

(75) Inventors: Gerhard Mueller, Wappingers Falls; Toshiaki Kirihata, Poughkeepsie, both of NY (US)

(73) Assignees: International Business Machines Corporation, Armonk, NY (US); Siemens Microelectronics, Inc., Cupertino, CA (US); SMI Holding LLC, San Jose, CA (US); Seimen Dram Semiconductor Corp., San Jose, CA (US); Infineon Technologies Corporation, San Jose, CA (US)

( * ) Notice: Subject to any disclaimer, the term of this patent is extended or adjusted under 35 U.S.C. 154(b) by 0 days.

(21) Appl. No.: 09/305,434

(22) Filed: May 5, 1999

(51) Int. Cl.[7] ....................................... G05F 11/16
(52) U.S. Cl. ........................... 327/526; 327/527; 365/200
(58) Field of Search .................... 327/525, 526; 365/200

(56) References Cited

U.S. PATENT DOCUMENTS

| | | |
|---|---|---|
| 4,689,494 * | 8/1987 | Chen et al. ........................ 327/525 |
| 4,990,992 | 2/1991 | Uchida . |
| 5,428,311 * | 6/1995 | McClure .......................... 327/525 |
| 5,452,258 | 9/1995 | Hotta . |
| 5,502,674 | 3/1996 | Griffus et al. . |
| 5,566,107 * | 10/1996 | Gilliam ............................ 327/525 |
| 5,600,277 * | 2/1997 | Koelling ........................... 327/526 |
| 5,640,338 | 6/1997 | Jung . |
| 5,712,588 * | 1/1998 | Choi et al. ....................... 327/525 |
| 5,748,527 * | 5/1998 | Lee et al. ..................... 365/185.09 |
| 5,926,034 * | 7/1999 | Seyyedy ........................... 327/525 |

* cited by examiner

*Primary Examiner*—Terry D. Cunningham
(74) *Attorney, Agent, or Firm*—Ratner & Prestia; H. Daniel Schnurmann

(57) ABSTRACT

A semiconductor integrated circuit device including a redundant metal line for replacing a non-operational metal line for connecting to a circuit block. The invention further includes a method for decoupling a defective or otherwise non-operational conductive data line from a circuit block to which it is connected, and replacing the defective conductive data line with a redundant line by coupling it to the same circuit block. A spare conductive block is not needed. The redundant metal lines may be used in multiple levels of hierarchy within an integrated circuit device.

13 Claims, 7 Drawing Sheets

METHOD AND APPARATUS FOR THE REPLACEMENT OF NON-OPERATIONAL METAL LINES IN DRAMS

FIELD OF THE INVENTION

The present invention relates most generally to semiconductor integrated circuit devices, the layout of integrated circuit devices, and methods for forming and operating these devices. More specifically, the present invention is directed to an apparatus and method for providing redundant conductive lines for accessing a circuit block within a semiconductor integrated circuit device.

BACKGROUND OF THE INVENTION

Semiconductor integrated circuits are comprised of a multiplicity of circuit blocks, each containing various circuit components. A multiplicity of conductive lines connect the circuit components and circuit blocks to other circuit elements, as well as to each other. Generally speaking, each circuit component and circuit block includes a highly integrated, densely packed multitude of individual features. Each individual circuit block occupies a significant amount of surface area within the semiconductor substrate on which the integrated circuit device is formed. The conductive lines which connect the circuit components and circuit blocks to each other and to other circuit elements, including external features, do not require significant surface area. When a conductive line which is formed to access a circuit component, is non-operational, then the individual circuit component cannot be accessed and is rendered useless. When a conductive line for accessing an entire circuit block is non-operational, the entire circuit block cannot be accessed and is therefore useless. When this occurs, a significant amount of the surface area which forms the integrated circuit is wasted.

Conductive lines are typically formed of metals such as copper, aluminum, or their alloys, and are generally relatively long lines which may surround or traverse a number of circuit blocks within an integrated circuit device. Relative to the features within a circuit block, the conductive lines are of considerably greater length because they connect the individual circuit blocks to any number of relatively remote components within the integrated circuit device. For example, in a random access memory (RAM) or a read only memory (ROM) device, the individual circuit components may be storage cells for a memory device. The storage cells for a memory device may be arranged in an array consisting of horizontal rows and vertical columns. Such an array may be considered a circuit block. In this configuration, each cell shares electrical connections with all the other cells in its row, and column. The electrical connections are provided by conductive data lines that may include horizontal lines connected to all the cells within a row, which are called word lines, and also vertical lines (along which data flows into and out of the cells), which are called bit lines. When the conductive data line that connects a memory cell to another component is defective, the memory cell is useless.

To address the problem associated with defective metal conductive lines, one approach may be to provide additional circuit components, for example: extra memory cells in a DRAM device. Using this approach, both an extra memory cell and an associated conductive data line must be provided. However, active circuit components such as a memory cell can require a considerable amount of surface area within the semiconductor substrate. As such, providing additional circuit components within a semiconductor integrated circuit device comes at the expense of providing a device of significantly reduced size. This is undesirable, as it allows for a lesser number of integrated circuit devices to be formed simultaneously within a substrate of fixed dimension (e.g. a six inch wafer). As such, adding additional circuit components to a semiconductor integrated circuit device may not be a cost-effective method for increasing yield.

As the number of levels of device hierarchy within an integrated circuit device increases, so, too does the deleterious effect of a non-functioning conductive line. For example, with respect to the DRAM device described above, when a read-write line is defective, then all of the individual memory cells which constitute an array or circuit block, and are connected by way of a bit line to the defective or non-operational read-write line, are rendered useless. To guard against the possibility that a read-write line may be defective, an additional multiplicity of cells which form the array, would be required. From this example it can be understood that providing spare circuit blocks or components in order to compensate for a potentially defective conductive line, is not always practical.

SUMMARY OF THE INVENTION

The present invention is directed to providing redundant lines for accessing a circuit block and/or circuit components within a circuit block. The present invention utilizes means for determining whether a conductive line is operational or non-operational, and also provides means for decoupling a non-operational conductive line from the circuit block when the conductive line is found to be non-operational, and means for coupling a redundant conductive line to the circuit block.

DETAILED DESCRIPTION OF THE INVENTION

Figure 1:
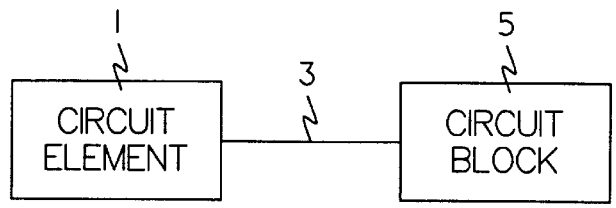
FIG. 1 is a circuit diagram showing a conductive line coupled to a circuit block as in the prior art.

FIG. 1 is a circuit diagram showing a simplified version of an exemplary embodiment as in the prior art. In FIG. 1, it can be seen that conductive line 3 provides electrical connection between two elements. In the figure shown, conductive line 3 connects circuit element 1 to circuit block 5. If conductive line 3 is defective or non-operational, then the connection between circuit element 1 and the circuit block 5 will not be made. In one embodiment, circuit element 1 may be an off-chip driver (OCD). It can be understood that this is an exemplary embodiment only, and that conductive line 3 may couple any two individual components or circuit blocks within an integrated circuit. It can be further understood that "circuit element" and "circuit block" are intended in the very broad sense and may represent any number of different components.

The conductive lines discussed herein will generally be data lines and may comprise bit lines, read write data (RWD) lines, column select (CSL) lines, bank column select (BCSL) lines, global column select (GCSL) lines, master data (MDQ) lines, local data (LDQ) lines, or other bit lines. The conductive lines and the associated redundant lines may be formed by any method common in the art. In the preferred method of formation, the conductive lines may be formed of metals such as aluminum, aluminum alloys, copper, or copper alloys, but other conductive films may be used.

In the preferred method of formation, a conductive film is a metal film formed by way of deposition over an insulating surface. Photolithographic means are then used to develop a pattern within a photosensitive coating formed on the metal film. An etching process may then be used to translate the pattern formed in the photosensitive film, to the metal film, by removing portions of the metal film which are exposed and not covered by the photosensitive coating. After portions of the metal film and the photosensitive coating have been removed, a metal wiring pattern results. The wiring pattern includes metal lines hereinafter referred to as conductive lines or conductive data lines generally. Alternate methods for forming such a wiring pattern may be used. An example of such an alternate method is damascene processing.

A typical semiconductor integrated circuit device is comprised of multiple levels of these wiring patterns, which are connected to each other and to other circuit elements, through openings formed in insulating films disposed between the levels. The present invention is addressed to providing a redundancy scheme within any of the multiple levels of wiring patterns, or may alternatively provide a redundancy scheme utilizing more than one level of the wiring pattern by providing a redundant conductive line formed within a wiring pattern of one level, to replace a non-operational conductive line from a wiring pattern of another level.

The present invention concerns the relative placement, the connective means, and the circuitry pattern formed within a wiring level, and with respect to other wiring levels. The present invention provides a redundancy scheme because of the arrangement of features within a semiconductor device, and is not intended to be limited to a specific method for forming the features within a semiconductor device such as the wiring pattern, or conductive lines.

Figure 2:
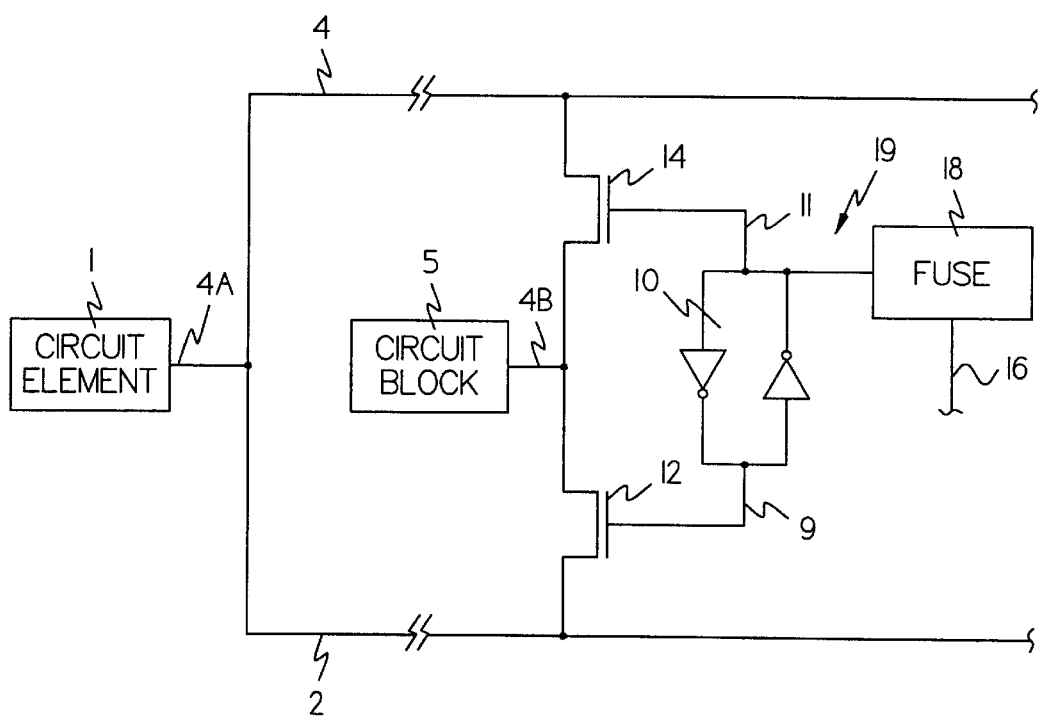
FIG. 2 is a circuit diagram showing a redundant conductive line adapted for coupling to a circuit block.

FIG. 2 is a circuit diagram showing an exemplary embodiment of the redundancy scheme of the present invention. In this exemplary embodiment, circuit element 1 is coupled to circuit block 5. Circuit element 1 may be an off-chip driver or an internal circuit. It can be understood that the redundancy scheme of the present invention can be equally applied to coupling any two features within a circuit. Conductive lines 2 and 4 are each adapted to provide electrical connection between circuit element 1 and circuit block 5. Conductive line 4 is initially coupled to circuit block 5 by way of transistor 14, and conductive data line 2 is adapted for coupling to circuit block 5 by way of transistor 12. It should be noted that FIG. 2 is not drawn to scale. In practice, conductive lines 2 and 4 comprise relatively long lines that may traverse or surround several other circuit blocks (not shown) as they make their way from circuit element 1 to circuit block 5. Conductive lines 2 and 4 may be formed from any of the metal films described above, and the metal film may comprise any of the multiple levels of metal films formed in fabricating the semiconductor integrated circuit device. In an alternative embodiment, the conductive lines may also include polysilicon lines.

Since the lines are relatively long and are configured to be routed around several other circuit blocks or components (not shown), they are prone to having opens or otherwise being defective or non-operational. Additionally, they may be shorted to other circuit features. In the semiconductor circuit as initially arranged, either of conductive line 4 and conductive line 2 could be used to initially couple circuit element 1 to circuit block 5.

In an exemplary embodiment, conductive line 4 will initially couple, or provide the electrical connection between, circuit element 1 and circuit block 5. This is because transistor 14 is initially in the "on" state providing for electrical connection between (coupling) conductive line 4 and circuit block 5, whereas transistor 12 is in the "off" state meaning that conductive line 2 is not electrically connected (coupled) to circuit block 5 initially. When the channel of a transistor is conductive, the transistor is considered to be in the "on" state. When the channel of a transistor is non-conductive, the transistor is considered to be in the "off" state. In the exemplary embodiment shown in FIG. 2, a logic high signal on the transistor gate turns the transistor to the "on" state, while a logic low signal on the transistor gate turns the transistor to the "off" state. In the configuration of FIG. 2, inverter latch 10 as initially set, provides a logic high signal to transistor 14 which is therefore in the "on" state, and provides a logic low signal to transistor 15 which is in the "off" state. Latch 10 consists of a pair of cross-coupled inverters.

In this exemplary embodiment, conductive line 2 serves as the redundant conductive line adapted to be coupled to circuit block 5. By providing switching means 19 and transistor 14, it is possible to decouple conductive line 4, which is advantageous for the case of a short between line 4 and a neighboring line, or for the case where conductive line 4 is otherwise non-operational. Switching means 19 also couples redundant conductive line 2 to replace conductive line 4. In another exemplary embodiment of the present invention (as will be seen in FIGS. 6 and 7), switching means may be provided to enable a single redundant conductive line to replace any one of multiple conductive lines that run from a circuit element 1 to different circuit blocks.

Any conventional means known in the art may be used to determine whether conductive line 4 is operational or non-operational. A non-operational line may be a line which is discontinuous, contains opens, is shorted to another feature, or is otherwise defective. In the preferred embodiment, an electrical continuity test may be performed upon the line, but other testing means may be used alternatively. A simple means for determining whether a conductive line is operational or non-operational, may include the following tests. Referring to conductive line 4, for example, a determination may be made as to whether conductive line 4 is operational between points 4A and 4B, essentially between circuit element 1 and circuit block 5 using an electrical continuity testing instrument.

In one embodiment, circuit element 1 may be an off-chip driver (OCD) having a three state input (logic high, logic low, and high impedance). After placing circuit element 1 in its high impedance state, a low voltage level may be applied at point 4A; then the voltage at point 4B may be measured provided that line 4 connects to circuit block 5 by way of transistor gates or the like, and not by way of a source/drain or other feature which may impose another potential on the line. Next, a high voltage may be applied at point 4A; then the voltage at point 4B may be measured. The voltage may be applied and detected using additional, conventional circuitry (not shown) which is common in the art. This additional circuitry may be external to the device, or it may be incorporated into the semiconductor integrated circuit device. If the voltage levels applied at point 4A are not measured accordingly by measuring means at point 4B, then conductive line 4 is determined to be non-operational between the two points 4A and 4B.

Another way to determine whether a conductive line within a DRAM is non-operational, is to measure the bit map of the DRAM using methods known in the art. By reading the bit map, it can be determined whether a bit line, a word line, or the conductive line connecting to an OCD is non-operational, since the defective or non-operational conductive line will affect the data pattern within the bit map.

It may be understood that any other means known in the art for determining whether a conductive line is operational or non-operational between two concerned circuit components, may be used alternatively.

If conductive line 4 is determined to be non-operational, then the result of this determination is sent by way of a signal 16 which blows fuse 18 within switching means 19. The output signal of the fuse will be either high or low depending upon whether the fuse is blown or not. When fuse 18 is blown, it resets latch 10 causing it to change state, reversing the coupling configuration and decoupling conductive line 4 from circuit block 5 by turning off transistor 14 by way of line 11, while also coupling line 2 to circuit block 5 by turning on transistor 12 by way of line 9. In this manner, conductive line 4 is decoupled, and conductive line 2 is coupled, in response to the determination of whether conductive line 4 is operational or non-operational. In this manner, circuit element 1 is now coupled to circuit block 5 by way of conductive line 2. In the exemplary embodiment shown in FIG. 2, the switching means is shown to include a single transistor, but it is understood that other switching means such as transmission gates (a p-channel transistor and an n-channel transistor back-to-back) may be used in alternative embodiments. In another embodiment, the non-operational line may be decoupled by using a laser (not shown) to selectively disconnect a portion of the non-operational line at a fuse point (not shown).

It can be seen that switching means 19 which provides for decoupling conductive line 4 and coupling conductive line 2 to circuit block 5, is responsive to the means for determining whether conductive line 4 is operational or non-operational. In the preferred embodiment, the means for determining whether a conductive line is non-operational may provide an output signal directly blowing the fuse.

Figure 2A:
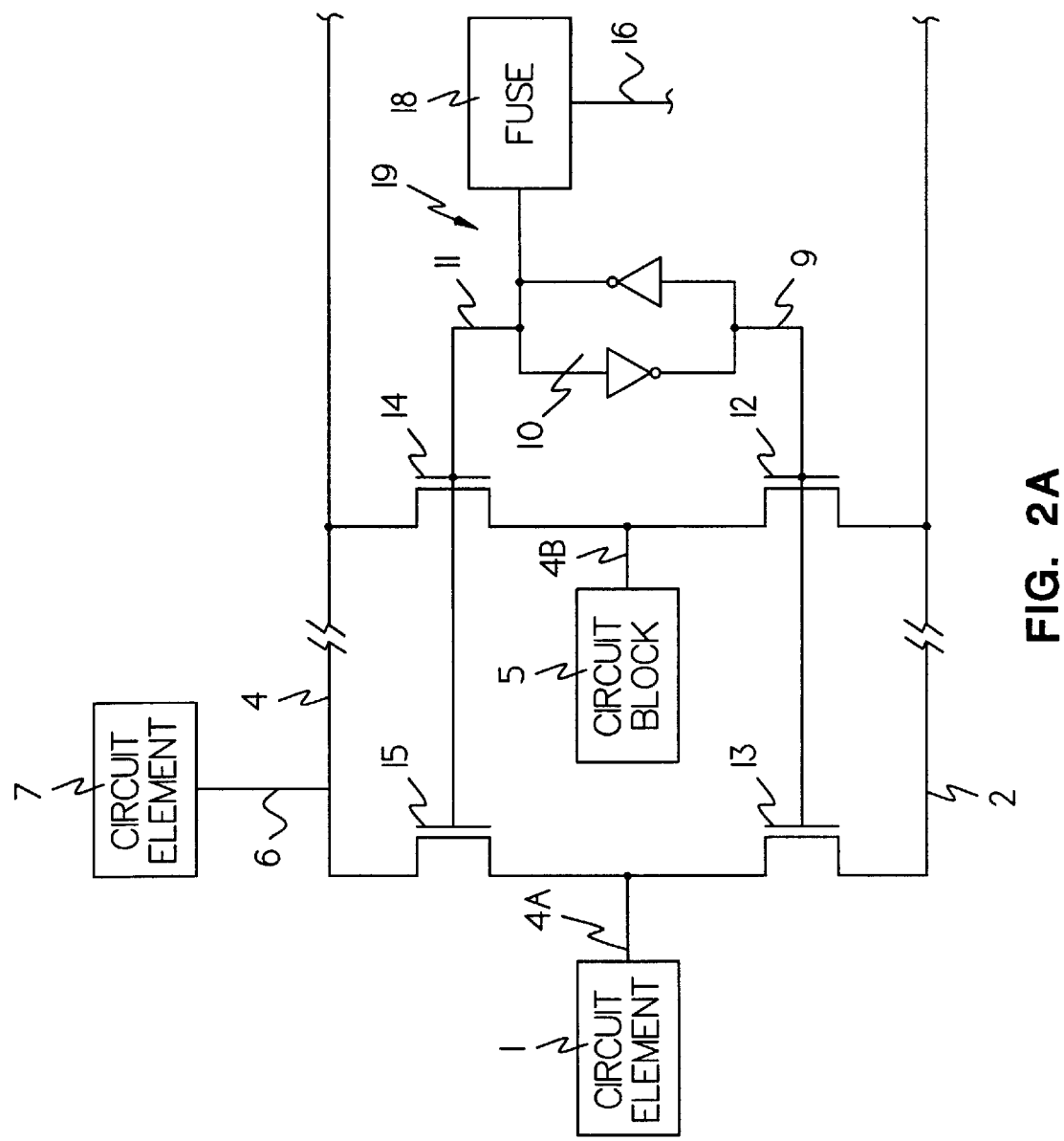
FIG. 2A is a circuit diagram similar to FIG. 2, but which includes additional transistors.

FIG. 2A is a circuit diagram similar to the circuit diagram as in FIG. 2, but containing additional transistors 13 and 15. For circuit element 1 to be coupled to circuit block 5 by way of line 4, it can be seen that both decoupling transistors 14 and 15 must be turned on. Likewise, for circuit element 1 to be coupled to circuit block 5 by way of line 2, both coupling transistors 12 and 13 must be turned on. In this alternate embodiment, if conductive line 4 is initially coupled to circuit block 5 and is found to be non-operational, then both decoupling transistors 15 and 14 are turned off and both coupling transistors 12 and 13 are turned on by latch 10 according to the present invention.

The advantage of providing multiple coupling and decoupling transistors or at least of locating the decoupling transistor in close proximity to circuit block 5, can be understood with respect to conductive line 4 and decoupling transistors 14 and 15. Decoupling transistor 14 is located generally distant from circuit element 1, whereas decoupling transistor 15 is located in close proximity to circuit element 1. By providing decoupling transistor 15 in close proximity to circuit element 1, circuit element 1 is effectively decoupled from any circuitry to which conductive line 4 may be shorted when decoupling transistor 15 is turned off. It can be seen that, if only transistor 14 were used to decouple circuit element 1 from circuit block 5, circuit element 1 would remain coupled to the bulk of conductive line 4. Thus, if conductive line 4 were shorted to circuit element 7 because of an undesired short between conductive line 4 and conductive line 6, for example, then circuit element 1 may undesirably interact with circuit element 7. By disposing decoupling transistor 15 in close proximity to circuit element 1, circuit element 1 is effectively decoupled from the bulk of the conductive line 4 and the possibility of a short between conductive line 4 and an undesired circuit element (such as circuit element 7) having an adverse effect upon circuit element 1, is thereby minimized.

Figure 3:
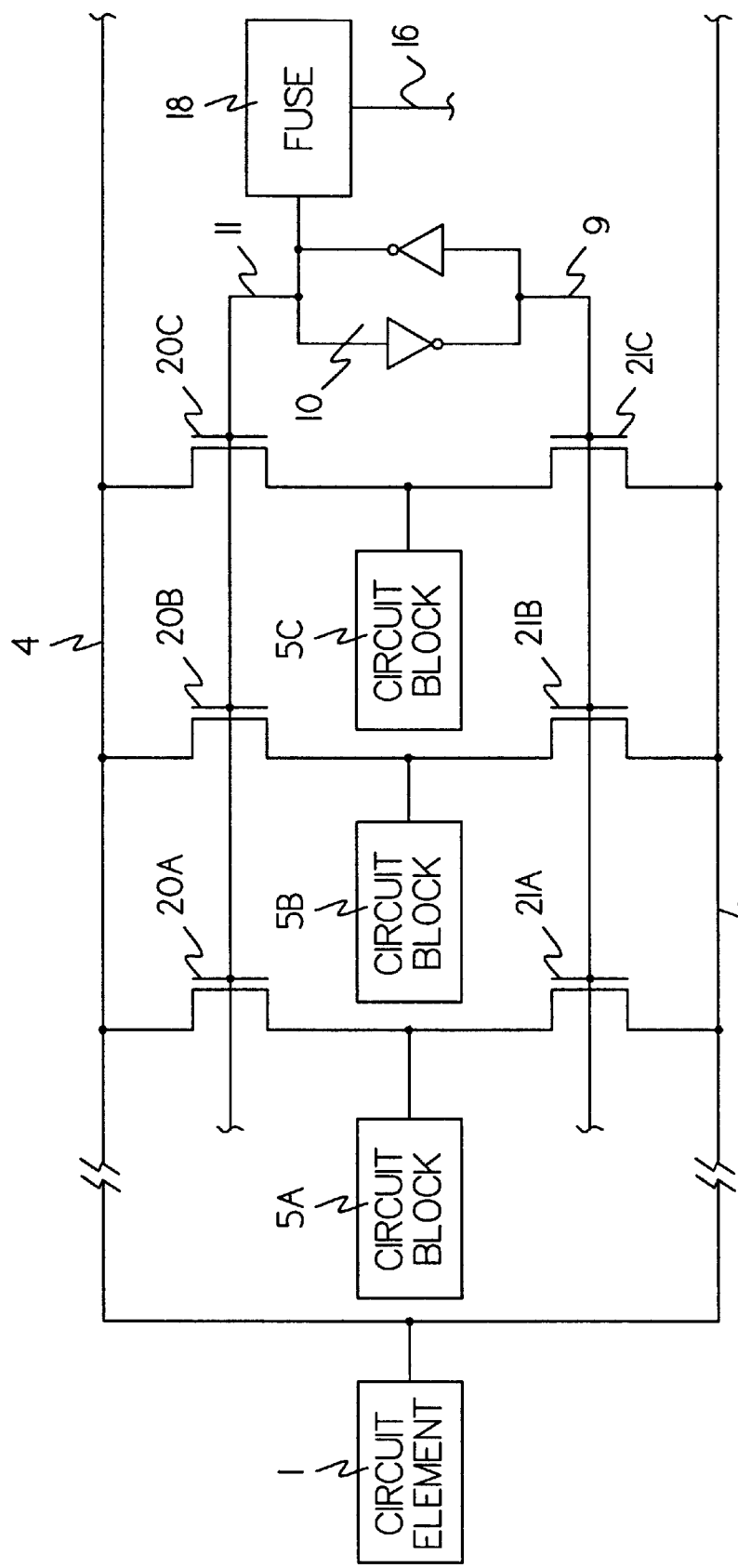
FIG. 3 is a circuit diagram showing a redundant conductive line adapted for coupling to a plurality of circuit blocks.

FIG. 3 is a circuit diagram showing an alternative embodiment to the circuit diagram shown in FIG. 2. In the embodiment shown in FIG. 3, each of conductive lines 2 and 4, which is coupled to circuit element 1, is adapted to be coupled to a plurality of circuit blocks as opposed to a single circuit block as shown in FIG. 2.

The circuit diagram in FIG. 3 shows three circuit blocks: circuit block 5A, circuit block 5B, and circuit block 5C. Conductive line 4 is adapted to provide an electrical connection to each circuit block. Conductive line 4 may be electrically connected/coupled to circuit block 5A by transistor 20A, it may be electrically connected/coupled to circuit block 5B by transistor 20B, and it may be electrically connected/coupled to circuit block 5C by transistor 20C. Likewise, conductive line 2 may be adapted to be electrically connected/coupled to circuit block 5A by transistor 21A, conductive line 2 may be adapted to be electrically connected/coupled to circuit block 5B by transistor 21B, and conductive line 2 may be adapted to be electrically connected/coupled to circuit block 5C by means of transistor 21C. The advantage of the present invention is achieved because if one conductive line, for example conductive line 4, is initially coupled to the plurality of circuit blocks 5A, 5B and 5C through transistors 20A, 20B, and 20C which are all in the "on" state, and conductive line 4 is determined to be non-operational with respect to either circuit block, latch 10 may be reset by a switching signal supplied from fuse 18 in response to that determination.

When the latch 10 is reset, it sends a logic low signal to transistors 20A, 20B, and 20C thereby turning transistors 20A, 20B, and 20C to the "off" state which decouples conductive line 4 from circuit blocks 5A, 5B and 5C. At the same time, latch 10 sends a logic high signal to transistors 21A, 21B, and 21C which were initially in the "off" state. As a result, transistors 21A, 21B, and 21C are changed to the "on" state thereby coupling conductive line 2 to circuit blocks 5A, 5B and 5C. In this manner, conductive line 2 serves as a redundant line. Conductive line 2 is used to provide an electrical connection between circuit element 1 and circuit blocks 5A, 5B and 5C, after conductive line 4 has been determined to be non-operational.

In alternate embodiments, the means for detecting whether the initially-coupled conductive line is operational between the two circuit elements of interest, may be varied. Likewise, the switching means responsive to means for determining that the initially-coupled conductive line is non-operational, may also be varied. Furthermore, the means for electrically coupling and decoupling the conductive lines to the circuit blocks which they are adapted for electrically contacting, may also be varied. In addition to the electrical means using transistors for switching which are included in the semiconductor integrated circuit as described above, the coupling and decoupling of conductive lines may be done by means of laser cutting or other mechanical means and may include components external to the integrated circuit device.

EXAMPLE I

DRAM Device

Figure 4:
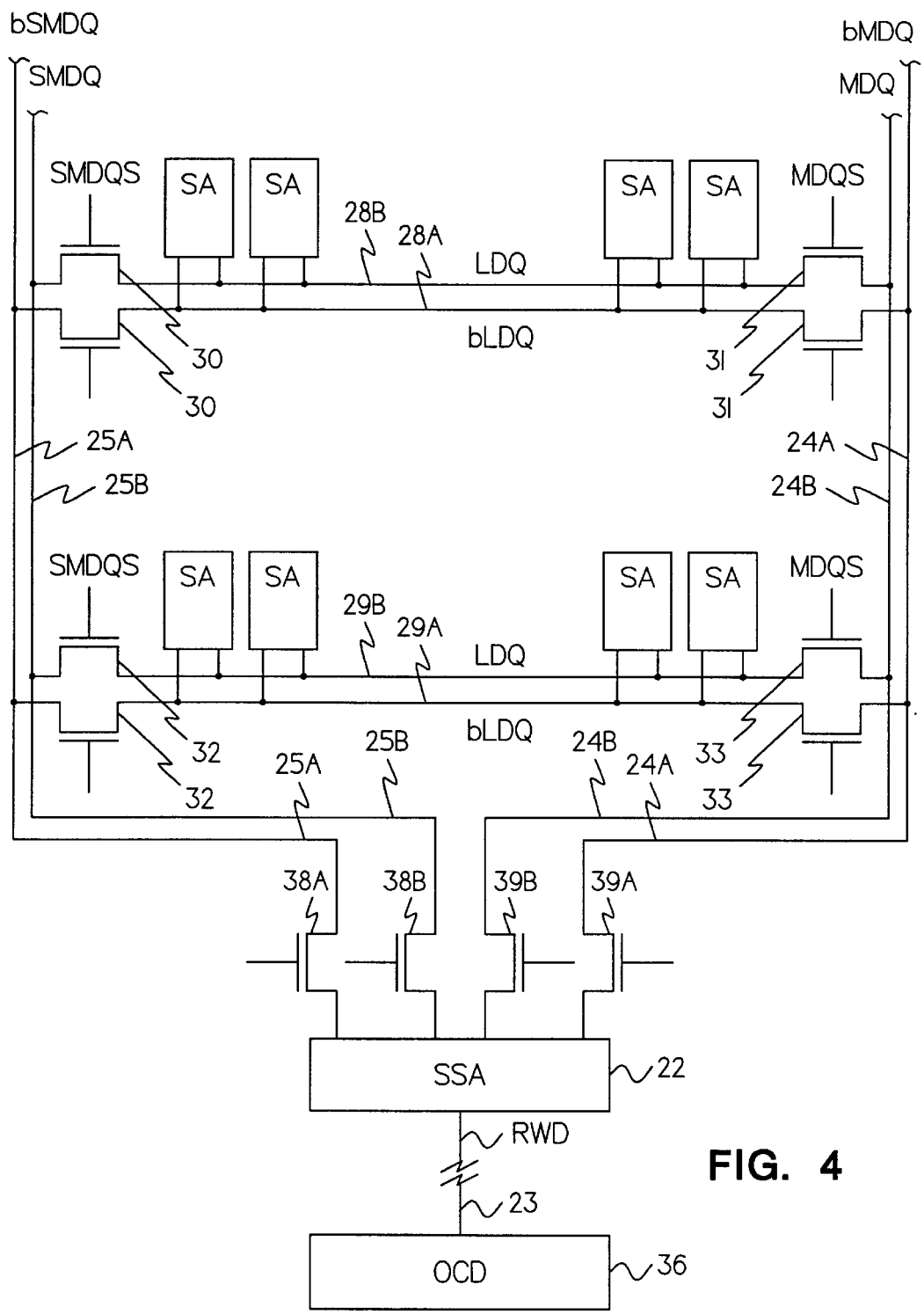
FIG. 4 is a circuit diagram showing an alternative embodiment of redundant conductive lines in a DRAM device.

Now turning to FIG. 4, a circuit diagram as applied to a DRAM device is shown. FIG. 4 describes schematically the column path in a DRAM device. Generally speaking, each sense amplifier (SA) amplifies the voltage difference between a bit line and bit line complement which reflect the data bit stored in a memory cell. One of the sense amplifiers (SA) is connected via a bit switch (controlled by a column select line, not shown) to the local data line pair LDQ. One out of several LDQ pairs is then connected to a master data line (MDQ) pair via an MDQS transistor. The differential voltage on either MDQ pair (24A and 24B, or 25A and 25B) is amplified by the second sense amplifier (SSA) 22. The SSA 22 then outputs this bit of information on the RWD (read-write-data) line 23. RWD line 23 then transports this bit to off chip driver (OCD) 36.

Still referring to FIG. 4, if, for example one of the lines of the master data line pair MDQ 24A and bMDQ 24B is determined to be defective (i.e. non-operational), the problem can be repaired by replacing the pair of lines 24A and 24B with the pair SMDQ 25A and bSMDQ 25B. The non-operational line pair may be decoupled from the LDQ line pairs 28A, 28B, and 29A, 29B, by means of MDQS transistors 31 and 33 respectively. The spare line pair SMDQ 25A and bSMDQ 25B can be coupled to the LDQ line pairs via coupling SMDQS transistors 30 and 32. This switching (coupling and decoupling) may be controlled by a conventional fuse (not shown) which, when blown, reverses the state of a latch (not shown) as described above. The determination of whether a conductive line is non-operational may be as described previously, and a signal, responsive to the determination, may blow the fuse.

The advantage achieved by the present invention is that of having redundant metal lines on a chip which forms a semiconductor device in order to replace non-operational metal lines without also having to provide additional, corresponding redundant cells. Applying this principle to DRAM devices, the prior art provides that if a metal line such as a column select line (CSL) is non-operational, a spare CSL line may be provided. The spare CSL line will be activated to replace the non-operational line. However, this spare CSL line will access spare cells which are also provided as required using conventional means. The present invention also provides for activating a spare metal line. This spare metal line, however, accesses the same cells which would have been accessed by the non-operational metal line. No spare cells are needed.

The concept of the present invention is intended to be broad in scope and may be applied to a broad range of conductive lines such as read-write data lines or bit lines such as bank columns select lines. For synchronous multi-bank DRAMs, the column select line (CSL) cannot be shared between different banks due to the possibility of data corruption. In order to perform a writing operation, the CSL must be activated. An already-activated bank which would receive the activated CSL, however, would open a bit switch and output data. In order to prevent this bus-contention conflict, a DRAM such as a 1 GB (Gigabyte) DRAM will have a hierarchical CSL-architecture. In a hierarchical CSL-architecture, two types of CSL lines are provided: global CSL lines (GCSL) and bank CSL lines (BCSL). Instead of having one bit switch, there are two bit switch transistors in series. The first is controlled by the BCSL. For every bank there are four BCSL-lines. The second bit switch transistor is controlled by GCSL. This signal is shared among different banks.

When a semiconductor DRAM device is formed using a three-level metal fabrication process, the GCSL lines are commonly formed from the third of the sequentially formed metal levels. The BCSL lines, as well as the GCSL lines are metal lines which run from the column decoder to the different sense amplifier banks in the unit. The BCSL and GCSL lines are of considerable length, and are therefore prone to opens, shorts, and other defects which render them non-operational. In a sense amplifier bank, vertical BCSL lines may also be formed of third level metal, and are connected to the horizontal BCSL lines which are formed of second level metal. If either a BCSL line formed from third metal level, or a BCSL line formed from second metal level should prove to be non-operational, the present invention provides for replacing any of these lines in the hierarchical structure, with a redundant metal line such as described in conjunction with a non-hierarchical structure.

It should be understood that the present invention can be applied equally to semiconductor devices other than DRAMs, and can be applied equally to various conductive lines formed from either of various metal levels within a multi-level metal process.

Figure 5:
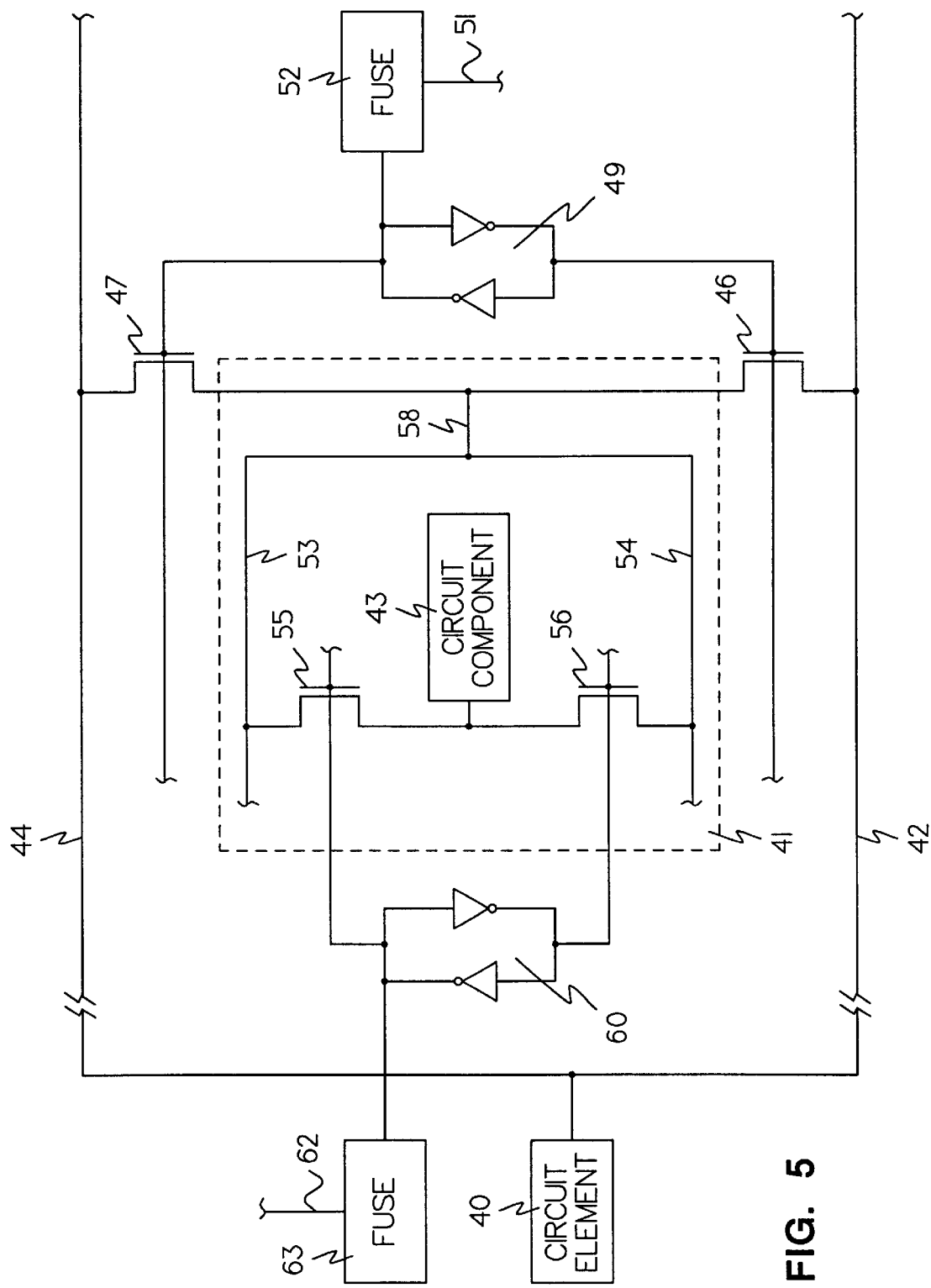
FIG. 5 is a circuit diagram showing a circuit utilizing multiple hierarchical levels of the redundant conductive lines of the present invention.

FIG. 5 shows a circuit diagram illustrating the concept of the present invention as applied to multiple levels within a hierarchical structure. Dashed lines represent a first circuit block 41 to which a connection with circuit element 40 is sought. Conductive lines 42 and 44 are each adapted for coupling circuit element 40 to circuit block 41 by means of transistors 46 and 47, respectively. As in the previous embodiments, one of the two conductive lines is initially electrically connected/coupled to circuit block 41. If the initially coupled line is found to be non-operational by determining means (not shown), then means, responsive to the determining means, supplies a signal 51 to fuse 52 which causes the latch 49 to change states, reversing the coupling configuration and decoupling the defective or non-operational line (either of conductive line 42 or 44) and electrically coupling the other "spare" conductive line to circuit block 41 by means of the associated transistor. In addition to the redundancy scheme provided to access circuit block 41, a further redundancy scheme according to the present invention is provided within circuit block 41.

Within circuit block 41, electrical connection is required between circuit element 40 and circuit component 43. Regardless of whether conductive line 42 or conductive line 44 is electrically coupled to circuit block 41, conductive line 58 is provided to be coupled to circuit component 43 within circuit block 41. In an exemplary embodiment as applied to a semiconductor memory device such as a DRAM, circuit block 41 may comprise an array of storage cells, and circuit component 43 may comprise a memory sub-block within the array. Lines 53 and 54 may be conductive data lines known as MDQ lines.

Conductive data line 58 may be coupled to circuit component 43 by either of conductive data line 53 or conductive data line 54. In one embodiment, conductive data line 53 may be initially coupled to circuit component 43 by means of transistor 55 which is in the "on" state. Initially, transistor 56 is in the "off" state rendering conductive data line 54 decoupled from circuit component 43. If conductive data line 53 is found to be non-operational by conventional determining means as used in the art and as described above, then means responsive to the determining means provides a signal 62 to fuse 63 which resets latch 60 thereby decoupling line 53 and coupling conductive data line 54 to circuit component 43. Coupling of conductive data line 54 to circuit component 43 is accomplished by means of transistor 56. In this manner it can be seen that the redundancy scheme of the present invention can be applied to multiple levels within a hierarchical structure.

As noted in conjunction with the description of the previous drawings, conductive lines 42 and 44, and 53 and 54 which utilize the redundancy scheme of the present invention, are not drawn to scale. Rather, each of these lines are relatively long and prone to defects rendering them non-operational. Also it should be noted that the circuit diagram is intended to be exemplary only, for the purpose of showing the redundancy scheme of the present invention. In practice, multiple levels of conductive layers can be used to form a semiconductor device, and multiple redundancy schemes in each level are possible because the multi-level metallization scheme and the transistors formed within the substrate, provide for intricate electrical connection patterns between the components formed of different conductive layers, which form the semiconductor device.

Figure 6:
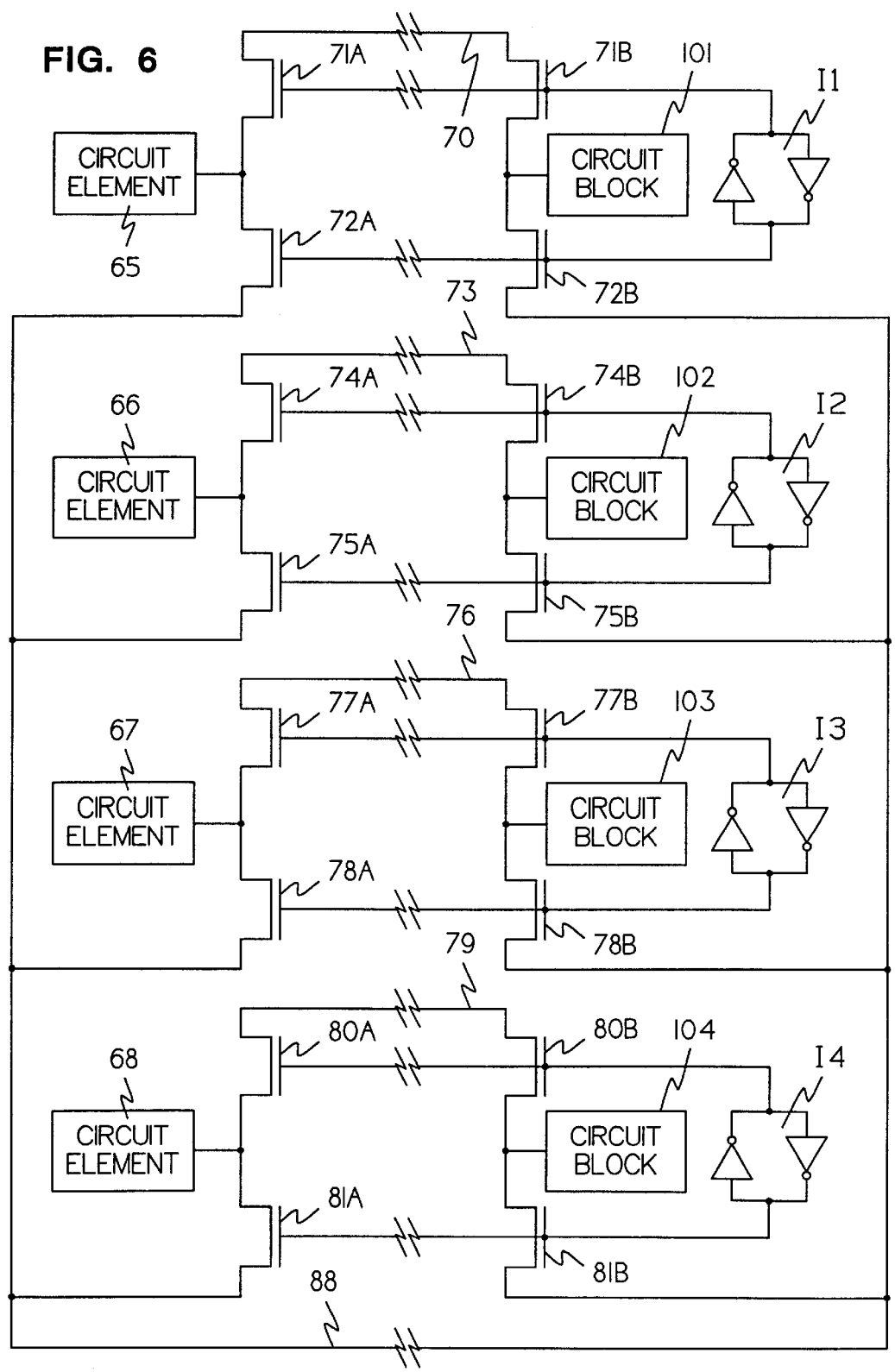
FIG. 6 is a circuit diagram showing a redundant conductive line which may be used to replace any one of a plurality of potentially non-operational conductive data lines.

FIG. 6 is a circuit diagram showing a single redundant conductive line which can be used to replace any one of a number of conductive lines. Circuit elements 65, 66, 67, and 68 are initially coupled to circuit blocks 101, 102, 103, and 104, respectively by means of conductive lines 70, 73, 76, and 79 respectively. The coupling of circuit element 65 to circuit block 101 is facilitated by conductive line 70 being coupled to circuit block 101 by transistor 71B and by transistors 71A and 71B being in the "on" state. The coupling of circuit element 66 to circuit block 102 is facilitated by conductive line 73 being coupled to circuit block 102 by transistor 74B and by transistors 74A and 74B being in the "on" state. The coupling of circuit element 67 to circuit block 103 is facilitated by conductive line 76 being coupled to circuit block 103 by transistor 77B and by transistors 77A and 77B being in the "on" state. Finally, the coupling of circuit element 68 to circuit block 104 is facilitated by conductive line 79 being coupled to circuit block 104 by transistor 80B and by transistors 80A and 80B being in the "on" state.

If any of conductive lines 70, 73, 76, or 79 is found to be non-operational by determining means known in the art and as described above, the redundancy scheme of the present invention provides for redundant conductive line 88 to replace any of the aforementioned conductive lines. For example, if conductive line 76 is determined to be non-operational, a switching signal (not shown) will be sent to latch I3 in response to that determination. The switching signal will reset latch I3 which will turn off transistors 77A and 77B thereby decoupling conductive line 76 and circuit element 67 from circuit block 103. Latch I3 also sends a logic high signal which turns "on" transistors 78A and 78B, thereby coupling conductive line 88 and circuit element 67 to circuit block 103. The same scenario may be equally applied to conductive line 70, 73, or 79, with each using conductive line 88 as the spare, or redundant line. In this manner, it can be seen that a further advantage of the present invention is realized because a corresponding redundant conductive line is not required for each potentially non-operational conductive line. Rather, it can be seen that for a plurality of lines, a single redundant line may be used to replace any one of the non-operational lines.

Figure 7:
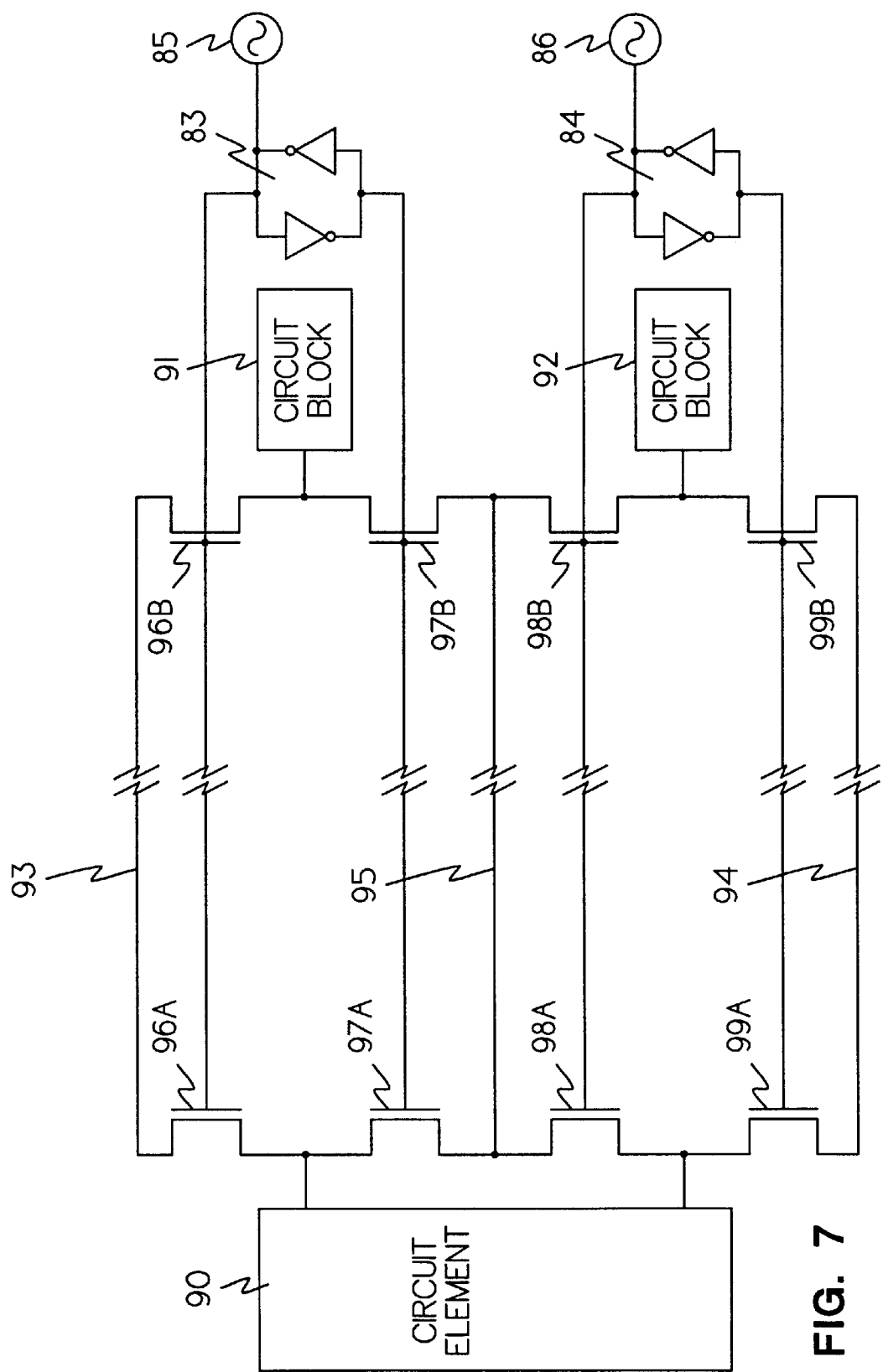
FIG. 7 is a circuit diagram showing another example of a redundant conductive line which is adapted to replace either of multiple potentially non-operational conductive lines.

FIG. 7 shows an exemplary embodiment of an alternate configuration for having a single redundant line available to replace any one of a plurality of other conductive lines which may be non-operational. In FIG. 7, redundant conductive line 95 is available to replace either of conductive lines 93 and 94 to provide an electrical connection between a single circuit element 90, and each of circuit blocks 91 and 92, respectively.

Circuit element 90 is initially electrically connected/coupled to circuit block 91 by means of conductive line 93. Circuit element 90 is also initially coupled to circuit block 92 by means of conductive line 94. Redundant conductive line 95 is available to replace either of lines 93 and 94 to provide connection to circuit blocks 91 or 92, respectively, if either of line 93 or 94 is determined to be non-operational. Means for determining whether a conductive line is non-operational and means for decoupling the non-operational line and coupling the redundant available conductive line, are as described in conjunction with previous exemplary embodiments. The circuit shown in FIG. 7 also includes the feature of multiple coupling transistors and multiple decoupling transistors as described in conjunction with FIG. 2A.

With respect to the electrical connection between circuit element 90 and circuit block 91 in FIG. 7, for example, circuit element 90 may be coupled to circuit block 91 by means of conductive line 93 initially. If conductive line 93 is found to be non-operational, then a signal responsive to that determination, causes fuse 85 to change the state of latch 83, reversing the initial coupling configuration thereby turning transistors 96A and 96B "off" in order to decouple circuit element 90 from conductive line 93 and to decouple conductive line 93 from circuit block 91. Likewise, both coupling transistors 97A and 97B will be turned "on to electrically couple conductive line 95, and thereby circuit element 90 to circuit block 91. Decoupling transistor 96A is located in close proximity to OCD 90 and provides the same advantage as described in conjunction with decoupling transistor or 15 of FIG. 2A. In an alternative embodiment, a single decoupling transistor may be used and will preferably be located in close proximity to circuit element 90 to decouple circuit element 90 from the non-operational conductive line and achieve the desired result as described in conjunction with FIG. 2A.

The previous embodiments were shown to illustrate some of the various embodiments of the present invention and are not intended to limit the scope nor the spirit of the present invention. The redundancy scheme may be applied to an unlimited variety of semiconduct or devices and is not intended to be limited to the exemplary embodiment of the DRAM device described herein. The specific arrangement of the features may be varied without departing from the scope of the present invention. The means for detecting whether a line is non-operational, the means for coupling a redundant metal line to circuit block, and the means for decoupling a defective metal line, are not intended to be limited to the means described herein. Rather, additional means may be used within the scope of t he present invention. The feature of using multiple coupling and decoupling transistors, and the feature of providing the decoupling transistor in close proximity to a circuit element to decouple the circuit element from the non-operational line and minimize the possibility that a short to another feature adversely affects the circuit element, may be included in any circuit arrangement of the present invention. The circuit blocks and circuit components referred to are intended to generally describe an element within a semiconductor integrated circuit. As such, they may include a memory cell, an array of memory cells, or any other circuit component provided within a semiconductor device.

Although illustrated and described herein with reference to certain specific examples, the present invention is nevertheless not intended to be limited to the details shown. Rather, various modifications may be made to the details within the scope and range of equivalence of the claims and without departing from the spirit of the invention. The scope of the present invention is expressed by the appended claims.

What is claimed:

1. A semiconductor device comprising:

a circuit block within a semiconductor integrated circuit;

a first conductive line electrically coupled to said circuit block;

a second conductive line adapted to be electrically coupled to said circuit block;

a first switch for electrically coupling and decoupling said first conductive line to and from said circuit block;

a second switch for electrically coupling and decoupling said second conductive line to and from said circuit block;

a first switching means comprising first means connected to said first and second switches for receiving a signal indicative of whether said first conductive line is operational or non-operational and selectively activating and deactivating one of said first and second switches;

wherein said circuit block further comprises:
   (a) a circuit component,
   (b) a third conductive line,
   (c) a fourth conductive line,
   (d) a third switch for electrically coupling and decoupling said third conductive line to and from said circuit component, and
   (e) a fourth switch for electrically coupling and decoupling said fourth conductive line to and from said circuit component; and a second switching means comprising second means connected to said third and fourth switches for receiving a signal indicative of whether said third conductive line is operational or non-operational and selectively activating and deactivating one of said third and fourth switches.

2. The semiconductor device as in claim 1, wherein said first switch and said second switch are each responsive to said first means of said first switching means and wherein said third switch and said fourth switch are each responsive to said second means of said second switching means.

3. The semiconductor device as in claim 1, wherein said first, second, third, and fourth conductive lines are each formed from a same metal film originally formed during fabrication of said semiconductor integrated circuit.

4. The semiconductor device as in claim 1, wherein one of said first, second, third, and fourth switches comprises a fuse element removable by exposure to a laser beam.

5. The semiconductor device as in claim 1, wherein said first, second, third, and fourth switches each includes a transistor formed within said semiconductor integrated circuit.

6. The semiconductor device as in claim 1, wherein at least one of said first, second, third, and fourth switches includes at least one switching transistor.

7. The semiconductor device as in claim 1, wherein at least one of said first and said second switching means includes a fuse.

8. The semiconductor device as in claim 6, further comprising a circuit element coupled to said first conductive line and said second conductive line.

9. The semiconductor device as in claim 1, wherein at least one of said first switching means and said second switching means further comprises a latch.

10. The semiconductor device as in claim 1, wherein said semiconductor device is a DRAM circuit and, said first conductive line and said second conductive line operate as master data lines and said third conductive line and said fourth conductive line operate as local data lines.

11. The semiconductor device as in claim 1, wherein said first conductive line and said second conductive line operate as bit lines and said semiconductor device is a DRAM circuit.

12. The semiconductor device as in claim 1, wherein said semiconductor device is a DRAM circuit and each of said first conductive line and said second conductive line operates as a column select line.

13. The semiconductor device as in claim 1, wherein said device is a DRAM circuit, each of said first conductive line and said second conductive line operates as a global column select line, and each of said third conductive line and said fourth conductive line operates as a column select line.

* * * * *